United States Patent
Bill

(10) Patent No.: US 10,269,789 B2
(45) Date of Patent: Apr. 23, 2019

(54) PROTECTION CIRCUIT FOR INTEGRATED CIRCUIT DIE-LET AFTER SCRIBE CUT

(71) Applicant: Synopsys, Inc., Mountain View, CA (US)

(72) Inventor: Colin Stewart Bill, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 70 days.

(21) Appl. No.: 15/283,178

(22) Filed: Sep. 30, 2016

(65) Prior Publication Data

US 2018/0096987 A1 Apr. 5, 2018

(51) Int. Cl.
*H01L 21/66* (2006.01)
*H01L 21/78* (2006.01)
*H01L 27/02* (2006.01)

(52) U.S. Cl.
CPC .......... *H01L 27/0292* (2013.01); *H01L 21/78* (2013.01); *H01L 22/34* (2013.01); *H01L 27/0266* (2013.01); *H01L 27/0296* (2013.01)

(58) Field of Classification Search
CPC ............. H01L 27/0266; H01L 27/0292; H01L 27/0296; H01L 21/78; H01L 22/30–22/34
See application file for complete search history.

(56) References Cited

U.S. PATENT DOCUMENTS

| | | | | |
|---|---|---|---|---|
| 6,137,338 A | * | 10/2000 | Marum | H01L 27/0251 327/309 |
| 6,240,535 B1 | * | 5/2001 | Farnworth | G01R 31/31701 257/E21.526 |
| 6,885,212 B2 | * | 4/2005 | Yamamoto | G01R 31/04 324/754.03 |
| 7,512,915 B2 | * | 3/2009 | Anand | H01L 22/34 324/750.3 |
| 7,692,483 B2 | * | 4/2010 | Ng | H03K 3/356182 327/208 |
| 9,046,573 B1 | * | 6/2015 | Watt | G06F 17/5045 |
| 9,728,474 B1 | * | 8/2017 | Yi | H01L 22/32 |
| 9,824,946 B2 | * | 11/2017 | Byun | G01R 31/318511 |
| 2002/0084512 A1 | * | 7/2002 | Terada | H01L 22/32 257/620 |
| 2003/0234393 A1 | * | 12/2003 | Cowles | G01R 31/2884 257/48 |
| 2006/0028227 A1 | * | 2/2006 | Kim | G01R 31/2884 324/750.01 |
| 2011/0186838 A1 | * | 8/2011 | Pagani | H01L 22/32 257/48 |
| 2017/0170081 A1 | * | 6/2017 | Byun | G01R 31/318511 |
| 2018/0088163 A1 | * | 3/2018 | Chang | G01R 31/002 |

* cited by examiner

*Primary Examiner* — Marvin Payen
*Assistant Examiner* — Jeremy J Joy
(74) *Attorney, Agent, or Firm* — Fenwick & West LLP

(57) ABSTRACT

A protection circuit for an integrated circuit product die or die-let (die-let) is responsive to whether the die-let has undergone a dicing operation or not. A test circuit on the die-let's semiconductor wafer can test and/or configure the die-let. After the dicing operation, the protection circuit generates a signal to isolate the cut input lines from the test circuit to prevent any interference with the normal operation of the integrated circuit product die-let.

15 Claims, 4 Drawing Sheets

PROTECTION CIRCUIT FOR INTEGRATED CIRCUIT DIE-LET AFTER SCRIBE CUT

BACKGROUND OF THE INVENTION

This invention is related to integrated circuit manufacturing in general and, more particularly, to the testing and/or configuration of the integrated circuit product dies or die-lets, small dies, on a semiconductor wafer.

Integrated circuit products are formed by multiple patterns of different material layers in, at, and on the surface of a semiconductor wafer. The same patterns are repeated over the surface of the semiconductor wafer which is then cut by a scribing saw in a dicing operation to separate the patterns of material layers. Each piece of the wafer with its pattern of material layers is a integrated circuit product die or die-let, both hereafter termed as a die-let.

While still part of the wafer, the die-lets are tested by connection to a test circuit or product set-up circuit, which tests and/or electrically configures the die-let for correct operation. Then the wafer is scribed or sawn in a dicing operation to separate the die-lets. Each separated die-let should be able to function in its configured state without any further electrical connection to the test circuit which had originally electrically configured the die-let.

During the dicing operation, the electrical connections between the test circuit and the die-lets are physically cut. Ideally these severed signal lines, typically formed from metal layers, should not interfere in any way with the normal operation of the die-let. However, the cutting process may not guarantee that the cut lines are totally isolated electrically. Electrical leakage at the cut line may interfere with the correct operation of the die-let.

Therefore, it is desirable that the die-lets be immune from the effects of the dicing operation in some manner. The present invention provides such a solution.

BRIEF SUMMARY OF THE INVENTION

The present invention provides for a protection circuit in an integrated circuit product die-let, the die-let having a plurality of input signal lines from a test circuit for testing and/or configuring the integrated circuit product die-let before a dicing operation which separates the integrated circuit product die-let from the test circuit on a semiconductor wafer. The protection circuit has: a first signal line, a logic block, and a resistive element. The first signal line has a first terminal extending to an edge of the integrated circuit product die-let and a second terminal. The logic block is connected between a first supply voltage and a second supply voltage, and has an input terminal connected to the second terminal of the first signal line, and a first output terminal forming a pathway for an isolation signal to a plurality of input test circuits within the integrated circuit product die-let, each input test circuit connected to one or more of the plurality of input signal lines from the test circuit before the dicing operation. The resistive element is connected between the first signal line and the second supply voltage, and is also connected to the second terminal of the first signal line. The resistive element generates an input signal to the logic block when the integrated circuit product die-let is separated from the test circuit by the dicing operation, the logic block generating the isolation signal in response to the input signal to the logic block whereby the circuits within the integrated circuit product die-let connected to one or more of the input signal lines from a test circuit before the dicing operation are isolated from the cut ends of the input signal lines at the edge of the product die-let after the dicing operation and the separation of the integrated circuit product die-let from the test circuit.

The present invention also provides for a method of operation of a protection circuit in a integrated circuit product die-let on a semiconductor wafer. The method includes the steps of: monitoring a signal on a first signal line from a test circuit on the semiconductor wafer; determining a change in the signal on the first signal line when the first signal line is cut between the integrated circuit product die-let and the test circuit during a dicing operation; generating an isolation signal in response to determining the change in the signal on the first signal line; sending the isolation signal to a plurality of input test circuits within the integrated circuit product die-let, each input test circuit connected to one or more of the plurality of input signal lines from the test circuit before the dicing operation; and each input test circuit isolating dicing operation cut ends of the input signal lines from the test circuit upon receiving the isolation signal in response to the isolation signal.

The present invention also provides for a semiconductor wafer which has at least one integrated circuit product die-let; a test circuit generating signals to test and/or configure the at least one integrated circuit product die-let; a protection circuit on the integrated circuit product die-let connected between the test circuit and the rest of the at least one integrated circuit product die-let, the protection circuit monitoring a signal on a first signal line from the test circuit when the die-let is connected to the test circuit and generating an isolation signal when has been physically cut from the test circuit to electrically isolate external cut lines from the internal parts of the die-let after a dicing operation; and a plurality of input test circuits on the integrated circuit product die-let, each input test circuit connected to one or more of the plurality of input signal lines from the test circuit before the dicing operation and isolating dicing operation cut ends of the input signal lines from the test circuit upon receiving the isolation signal.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1A:
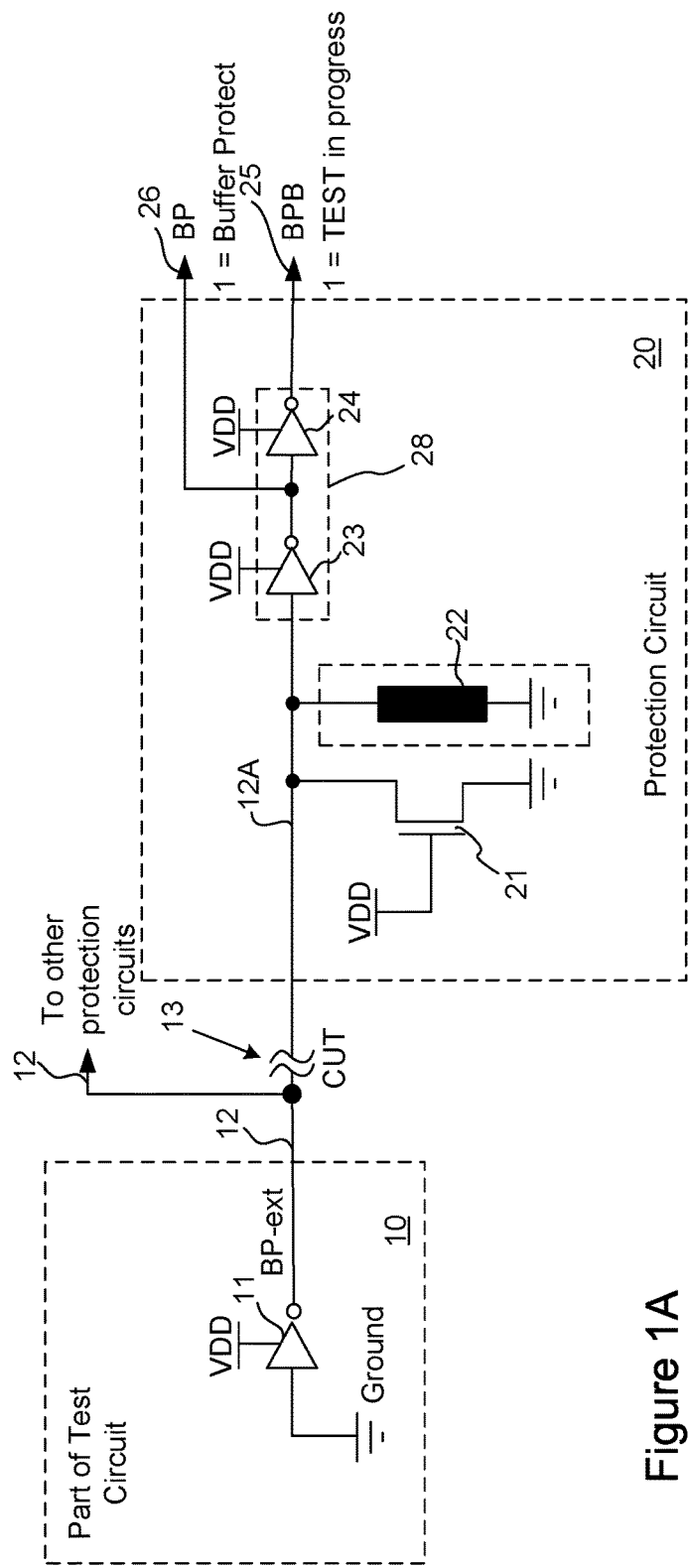
FIG. 1A shows part of a test circuit and a die-let protection circuit which are on a semiconductor wafer in accordance with the present invention.

In a typical integrated circuit manufacturing process, patterns of different material layers are repeated over a semiconductor wafer to create nascent multiple integrated circuit product die-lets on the wafer. Before the integrated circuit products are physically separated into individual die-lets by a dicing saw cutting through the wafer, the individual integrated circuit product die-lets are tested and/or configured on the wafer. Testing and/or configuration may be performed by a testing circuit external to the wafer with probes which are positioned to contact various conducting signal lines, called leads, of the integrated circuit product to be tested at predetermined locations of the lines.

Alternatively, the testing circuits can be created on the semiconductor wafer along with the integrated circuit products in the manufacturing process and the testing/configuration of the integrated circuit products can be performed through these testing circuits. There may be several test circuits on the wafer with each test circuit connected to one or more integrated circuit product die-lets and for each prospective die-let there may be one or more instantiations per test circuit. A decoder may be used by the test circuit to identify each instantiation in the connected integrated circuit products. The integrated circuit product die-lets are tested and configured by the test circuit(s). The integrated circuit product die-lets are then scribed or physically cut away from the test circuit in the dicing operation. The die-let after the cut is able to function in its configured state without any further electrical connection to the test circuit that originally configured the die-let.

During the dicing operation, electrical connections between the test circuit and the die-let are physically cut. These cut lines (usually on metal layers) ideally should not interfere in any way with the normal operation of the cut integrated circuit product die-let. But the cutting operation may not guarantee that the cut lines are totally electrically isolated after cutting. Electrical leakage at the cut line may cause incorrect operation or failure of the integrated circuit product die-let.

In accordance with the present invention, a protection circuit is placed on the integrated circuit product die-let between the test circuit and the rest of the integrated circuit product. The protection circuit determines whether the die-let is connected to the test circuit or has been physically cut from the test circuit. In response to that determination, the output of the protection circuit is used to electrically isolate the external cut lines from the internal parts of the die-let after dicing. This removes the possibility of electrical interference on the cut lines causing poor operation or even outright failure of the integrated circuit product die-let. Of course, these problems are of no concern if the integrated circuit product die-let is not under power, so the statements above refer to a powered integrated circuit product die-let.

Protection Circuit

FIG. 1A is a representation of part of a test circuit 10 and a protection circuit 20, according to one embodiment of the present invention. Both the test circuit 10 and the protection circuit 20 are part of a semiconductor wafer. The protection circuit 20 is part of a integrated circuit product die-let and the test circuit 10 is separate from the die-let. The test circuit 10 is connected to one or more die-lets. In FIG. 1A, the test circuit 10 is shown as being connected to a plurality of die-lets.

As explained above, the test circuit 10 can be used to not only test the integrated circuit product die-lets to which the circuit 10 is connected but also to configure the die-lets. Hence it should be understood that the word, test, can refer to testing and/or configuration of the integrated circuit product die-lets. The protection circuit 20 protects signal lines between the integrated circuit product die-let and the test circuit 10 from interfering with the integrated circuit product die-let electrically after the lines are cut by the dicing operation. These signal lines can include digital signal lines, analog signal lines and high voltage signal lines.

Only that portion of the test circuit 10 which relates to the protection circuit 20 is shown in the drawing. As shown in FIG. 1A, the test circuit 10 has a logic driver 11, an inverter circuit, which is connected between a system supply voltage $V_{DD}$ and ground (that connection is not shown in the drawings) during operation. The input to the logic circuit 11 is normally also ground. Note, however, that the input to the circuit 11 can be set to logic '1' for a special test where the die-let is caused to electrically operate as if it were already diced, even though it has not yet been diced. This type of test may be used to show that, once diced, the die-let will operate correctly with the configuration that had been set before dicing. The output of the logic driver 11 is connected to a digital signal line 12, here named "BP ext," (for Buffer Protect-external), which conducts a continuous direct current (DC) that flows to ground at one or more of die-lets before the dicing operation. FIG. 1A shows that the BP ext signal line 12 is also connected to protection circuits 20 belonging to other die-lets. Again it should be noted that only part of the test circuit 10 is shown; other signal lines for the testing and/or the configuration of the die-let are not shown.

Figure 1B:
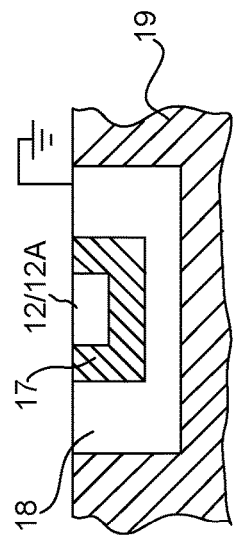
FIG. 1B is a cross-sectional view of the signal line 12/12A at the cut location 13 in FIG. 1A.

Each BP ext signal line 12 from the test circuit 10 is connected to the protection circuits 20 of a plurality of die-lets through a location 13 where a cut is made during the dicing operation. The digital signal line 12 continues as a signal line 12A in the protection circuit 20. At least at the cut location 13 the signal line 12/12A is constructed so as to be surrounded by grounded metal, such as illustrated by the cross-sectional view of FIG. 1B. The grounded metal is in the form of a metal trough 18 with an insulating layer 17 between the signal line 12/12A and the trough 18 which itself is surrounded by another insulating layer 19. The metal trough is electrically grounded, or connected to the same electrical potential as the lower supply voltage. This construction ensures that after the dicing operation, any electrical leakage from the cut line 12A will be to the ground potential and there is no electrical leakage from the signal line 12A to the supply voltage at $V_{DD}$. Any electrical leakage appearing on the BP line 12A caused by any imperfections in the dicing process is grounded. Such possible external leakage is allowable between the line 12A and ground and does not affect the performance of the separated die-let.

The protection circuit 20 is formed by the signal line 12A which is connected to the input of a logic block 28 formed by two logic inverters connected in series. The first logic inverter 23 has its input connected to the signal line 12A; the output of the first logic inverter is connected to a first signal line 26, termed BP (Buffer Protect), and to the input of a second logic inverter 24 whose output is connected to a second signal line 25, termed BPB (Buffer Protect Bar). Each of the two inverters 23 and 24 is connected to the supply voltage at $V_{DD}$ and a second supply voltage at ground (which connection is not shown in the drawings). The signal line 12A connected to the BP-ext signal line 12 from the test circuit 10 is further connected to a resistive component. In FIG. 1A, the resistive component is an NMOS transistor 21 having one source/drain connected to the line 12A and the other source/drain connected to ground. The gate of the transistor 21 is connected to the system supply voltage $V_{DD}$. Alternatively, the resistive component can be a diffusion, polysilicon or a metal-based resistor having one terminal connected to the line 12A and the other terminal connected to the second supply voltage, ground. Such a resistor 22 is illustrated in FIG. 1A; the surrounding dotted rectangle indicates that it is an alternative to the transistor 21.

Before the dicing operation, the output of the logic driver 11 of the test circuit 10 provides a continuous direct current (DC) on the signal line 12, here named "BP ext." The current flows to ground at one or more of the connected die-lets. The continuous current flows as long as a die-let remains physically and electrically connected with the test circuit 10 (and, of course, there is power is supplied). The magnitude of the continuous current provides only a small voltage drop along the BP-ext line 12 in order that the protection circuit 20 at the die-let gets a strong signal. The BP-ext voltage value is close to the $V_{DD}$ value before dicing. The protection circuit 20 senses the state of the BP-ext line 12 on the signal line 12A which continues into the protection circuit 20 and generates a signal BPB (BP-bar) at the output terminal of the logic inverter 24. This signal when high or "1" indicates that test circuit 10 is connected to the die-let and that testing and/or configuration of die-let can or is to be performed.

Figure 2:
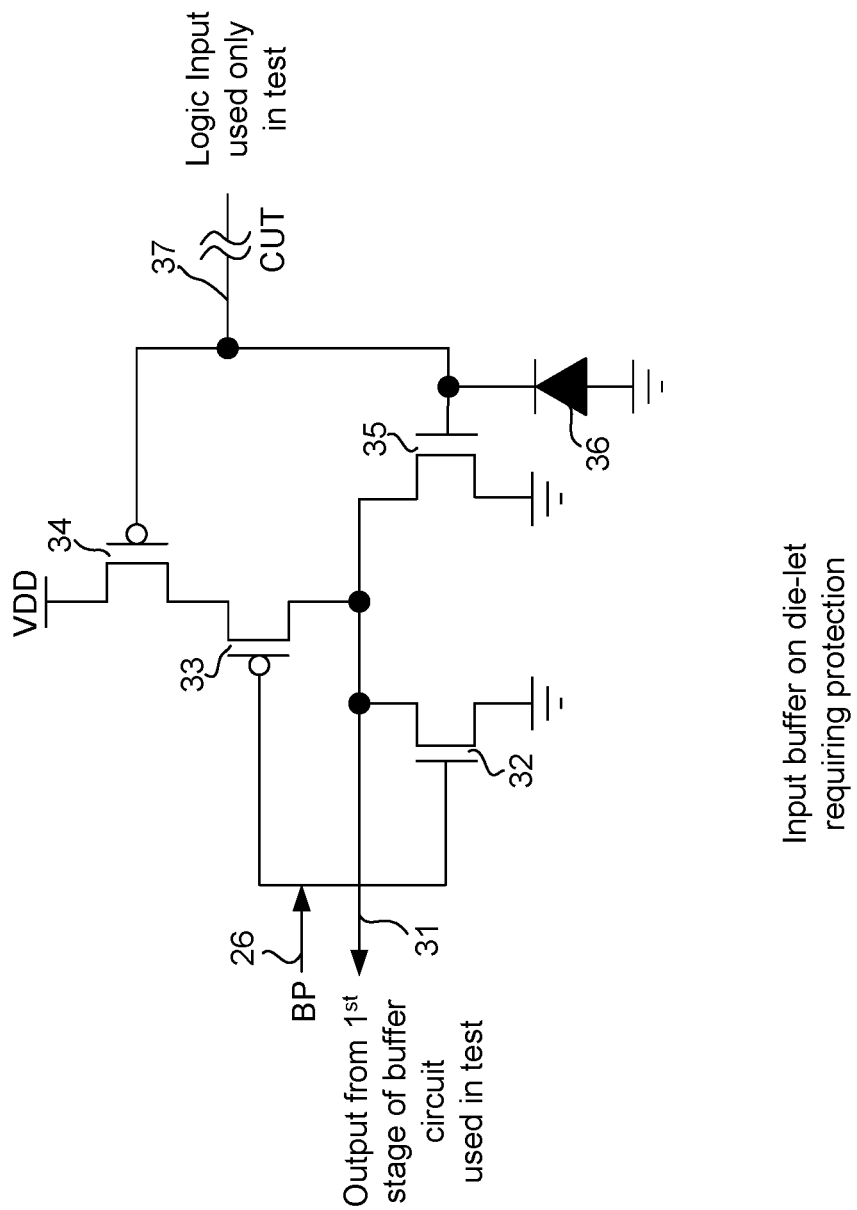
FIG. 2 shows a first stage of an input logic buffer of a die-let receiving signals from a test circuit before the dicing operation and isolated from electrical interference by the protection circuit of FIG. 1A after the dicing operation.
Figure 3:
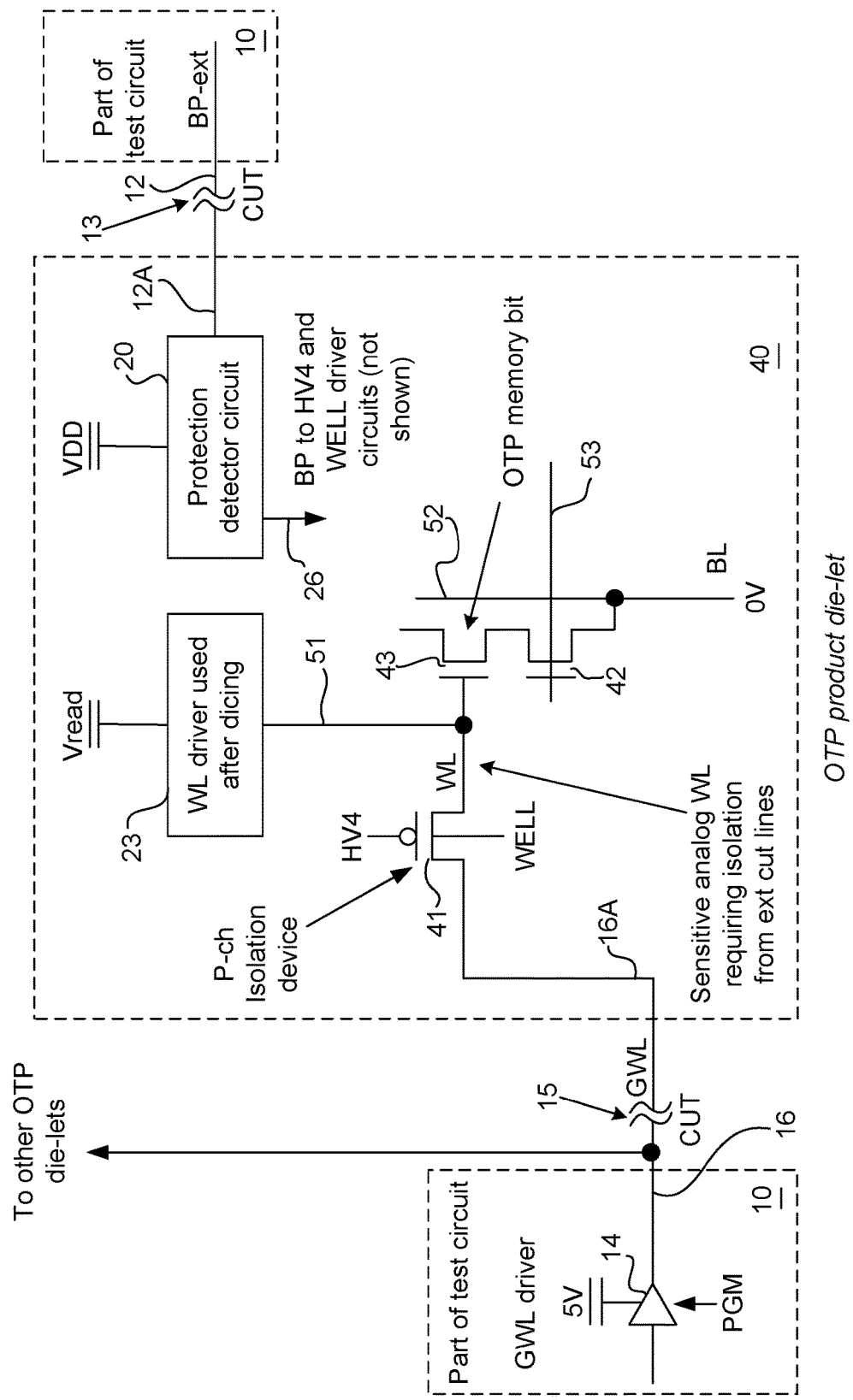
FIG. 3 is a representation of a die-let with OTP memory cells which are configured by high voltage signals from a test circuit before the dicing operation and isolated from electrical inference by a FIG. 1A protection circuit after the dicing operation.

After dicing, the voltage on BP line 12A falls to 0V and the test signal lines outside the die-let are cut away by the dicing saw. The protection circuit 20 is left on the die-let. The protection circuit 20 senses the state of the BP line 12A and generates a high or logic "1" BP signal at the output terminal 26 of the logic inverter 23. The output signal BPB, on the other hand, at the output terminal of the inverter 24 is low, or logic "0'. The BP signal can now be used to "protect" the input signal lines for a large number of other test signals entering the die-let before the dicing operation from interfering with the operation of the integrated circuit product die-let circuits after the dicing operation. This includes 1) disabling the first or input stage of the logic buffers, such as Address Input buffers as illustrated by the circuit of FIG. 2, such that the test floating address line (after being cut) does not cause leakage between $V_{DD}$ and the ground inside the buffer; 2) providing a high impedance path between a sensitive analog node, internal to the die-let and the cut line, which now floats, that had been used to drive the internal analog line before the dicing operation. Such high impedance isolation gate protects the internal sensitive analog line from possible leakage or electrical interference at the sawn-off, cut line. FIG. 3 shows where such a high impedance path is used in a One-Time Programmable (OTP) die-let; and 3) providing a high impedance path between a cut line which had originally been driven from a high voltage signal source outside the die-let, before dicing, and the internal high voltage node remaining in the die-let after dicing.

Returning to the FIG. 1A, it should be noted that the protection circuit 20 is constituted by a few transistors and conducting lines occupying a very small space in the surface of each die-let. Hence while conferring the described benefits, the protection circuit "costs" in terms of semiconductor space is advantageously very low.

Examples of Integrated Circuits Protected by the Protection Circuit

FIG. 2 shows a first or input stage of a logic buffer circuit which is used in a die-let to receive logic signals from its test circuit 10 to test and/or configure the die-let. The input stage has a PMOS transistor 34 having one source/drain connected to the $V_{DD}$ voltage supply and a second source/drain connected to, or a part of the source/drain of a second PMOS transistor 33. The second source/drain of the PMOS transistor 33 is connected to the source/drains of two NMOS transistors 32 and 35 connected in parallel with the second source/drains of the NMOS transistors 32 and 35 are connected to the second supply voltage, ground. The gates of the PMOS transistor 34 and NMOS transistor 35 are connected to an input terminal 37 which receives the logic signals from the test circuit 10 during test. A reverse-biased diode 36 is also connected to the input terminal 37. As shown in the drawing, the input terminal 37 is cut during the dicing operation. The gates of the PMOS transistor 33 and NMOS transistor 32 are connected to the BP signal line 26 from the protection circuit 20 of FIG. 1.

Before the dicing operation, BP signal of the protection circuit 20 is at 0 volts, ground. This turns on the PMOS transistor 33 and turns off the NMOS transistor 32. The test circuit 10 sends logic signals through the input terminal 37 and the reverse bias of the diode 36 allows the input logic signal to turn the PMOS transistor 34 and NMOS transistor 35 off and on. The resulting signal from the first stage output terminal 31 is passed on to the rest of the die-let for testing/configuration.

During the dicing operation, a dicing saw or scribe-saw cuts through the perimeter of the die-let. In the case where an external signal directly drives a MOS gate on the die-let before dicing (an example is the input to a logic inverter), the gate oxide(s) of the MOS device(s) may be susceptible to damage by charges generated by the scribe saw during the dicing operation. To protect against the scribe saw-generated charge, the MOS gate is protected by adding a charge leakage device between the signal line carrying the external signal to the MOS gate and the product substrate, which is normally connected to the product ground path. An example of such charge leakage device is a junction diode which in normal operation of the die-let is reverse-biased.

After the dicing operation and the separation of the test circuit 10 from the die-let, there is no need for the input buffer circuit and the signals from the input terminal 37. The BP signal from the protection circuit 20 is now logic "1" to turn off the PMOS transistor 33 and turn on the NMOS transistor 32. The first stage output terminal 31 is isolated from the $V_{DD}$ voltage supply and grounded by the transistor 32. The input stage is effectively disabled and isolated from any internal nodes or circuits of the integrated circuit product die-let.

FIG. 3 illustrates a die-let 40 with a signal line which carries a high voltage signal from a test circuit 10. The voltage is called high in comparison to the normal operating voltage of integrated circuit product die-let. In the drawing portions of the test circuit 10 are shown on both sides of the die-let 40. The portion of the test circuit 10 on the right side of the drawing supplies the BP-ext signal for the protection circuit 20 described above. The portion of the test circuit 10 on the left side of the drawing generates a high voltage signal on a signal line 16 which connects into the die-let 40 and continues on to other die-lets. In this example, the high voltage signal is generated by a driver circuit 14 operating at a 5 V power supply voltage and ground (not shown) having a PGM (Program) input signal for high voltage operation.

In this example, the integrated circuit product die-let 40 has one-time programmable (OTP) memory cells of which only one is shown in FIG. 3 for simplicity's sake. The programming of the OTP memory cells configures the die-let 40. The exemplary OTP memory cell has a pass MOSFET (Metal-Oxide-Semiconductor Field Effect Transistor) 42 connected to a programmable element in the form of a second MOSFET 43 by a common source/drain region. The other source/drain region of the pass transistor 42 is connected to a bit line 52, while a gate of the transistor 42 is connected to a read word line 53. The programmable transistor 43 has its other source/drain electrically floating and its gate connected to a programming word line 51 which in turn is connected to a word line driver circuit 23. The gate of the programming transistor 43 is also connected to a word line 16A through a P-channel MOSFET 41, which acts as an isolation device as explained below. The word line 16A is connected to the driver circuit 16 of the test circuit 10 before the dicing operation.

The OTP memory cell is one of a plurality of OTP memory cells which are programmed to configure the die-let in which the cells are located. Programming is performed by the test circuit 10 before the dicing operation. The particular OTP memory cell to be programmed is addressed by address signals and programming mode selected by control signals from the test circuit 10 through the first stage of the buffer circuit, such as illustrated in FIG. 2. The voltage on the bit line 52 is dropped, shown in the drawing as 0V, and the voltage on the reading word line 53 is set to turn the pass transistor 42 on. The driver circuit 14 of the test circuit 10 drives the high voltage on the signal line 16 and the GWL line 16A on the die-let. With a low voltage on its gate, the P-channel MOSFET 41 is turned on to impose a high voltage across the gate oxide of the programming MOSFET 43 causing the gate oxide to rupture. A conducting plug is formed through the gate oxide to form a programmed connection between the gate electrode and the source/drain region and/or the underlying body of the transistor 43. The transistor 43 is programmed. The programming of OTP memory cells as described is well known to practitioners in the semiconductor field.

After the dicing operation the signal line 16/16A is cut (illustrated by location 15), as well as the cut at location 13 for signal line 12/12A as previously described. The BP on the signal line 26, now "1" after the dicing operation is used to engage driver circuits (not shown) with a signal termed "HV4" to the gate electrode of the P-channel MOSFET 41 and with a signal termed "WELL" to the channel region of the transistor 41. The two signals are equivalent positive voltages to effectively turn off the transistor 41. This action isolates the node 51 and the gate electrode of the programming transistor 43 from any electrical interference on the signal line 16A and permits the word line driver 23 to operate without possible outside electrical interference when the integrated circuit product die-let is in normal operation.

A protection circuit of the present invention may even be used for protecting logic power supplies. For example, there are some electronic products which are powered by RF (Radio Frequency) sources. These products harvest the wireless energy of RF signals, though the amount of power available to the product is very low. If the product is a die-let which before dicing relies upon a power supply at $V_{DD}$ provided by the wafer test circuit outside the die-let and after dicing relies upon the RF-harvested energy inside the die-let, any electrical leakage on the cut $V_{DD}$ power supply line will dissipate the harvested energy. In the worst case the internal power supply nominally at $V_{DD}$ is forced to 0V.

This embodiment of the protection circuit provides for a $V_{DD}$ isolation switch. The switch passes the $V_{DD}$ power supply voltage from the test circuit through to the die-let before dicing. After dicing, the switch acts as an isolation device to prevent any leakage of the RF-harvested energy. An example of such an isolation switch is shown in the FIG. 4 protection circuit 60 having an NMOS transistor switch 61 with "VDD external" on its drain and "VDD internal" on its source, i.e., the NMOS transistor 61 sits between the $V_{DD}$ power supply line $17_{int}$ which is connected to the circuits of the die-let and the $V_{DD}$ power supply line $17_{ext}$ which, before dicing, leads to the test circuit 10. The $V_{DD}$ voltage may be 0.8V, for example, in a 14 nm or 16 nm MOSFET manufacturing process. In order to pass the $V_{DD}$ power supply voltage from the test circuit 10 to the die-let circuits a much higher voltage is applied to the gate of the transistor 61 by a line 18. For example, 1.8 V should be readily available from the test circuit 10. Due to the 1.8 V gate voltage, the NMOS transistor 61 is a thick oxide device. The gate of the transistor 61 is connected to ground through a resistive component 62, here shown as a second NMOS transistor with its gate at $V_{DD}$. Before dicing, the 1.8V supply provides a small current to the resistive component 62 to maintain the transistor 61 gate voltage close to 1.8V. An example of the current through the component 62 is 5 µA though different current values may be used.

Figure 4:
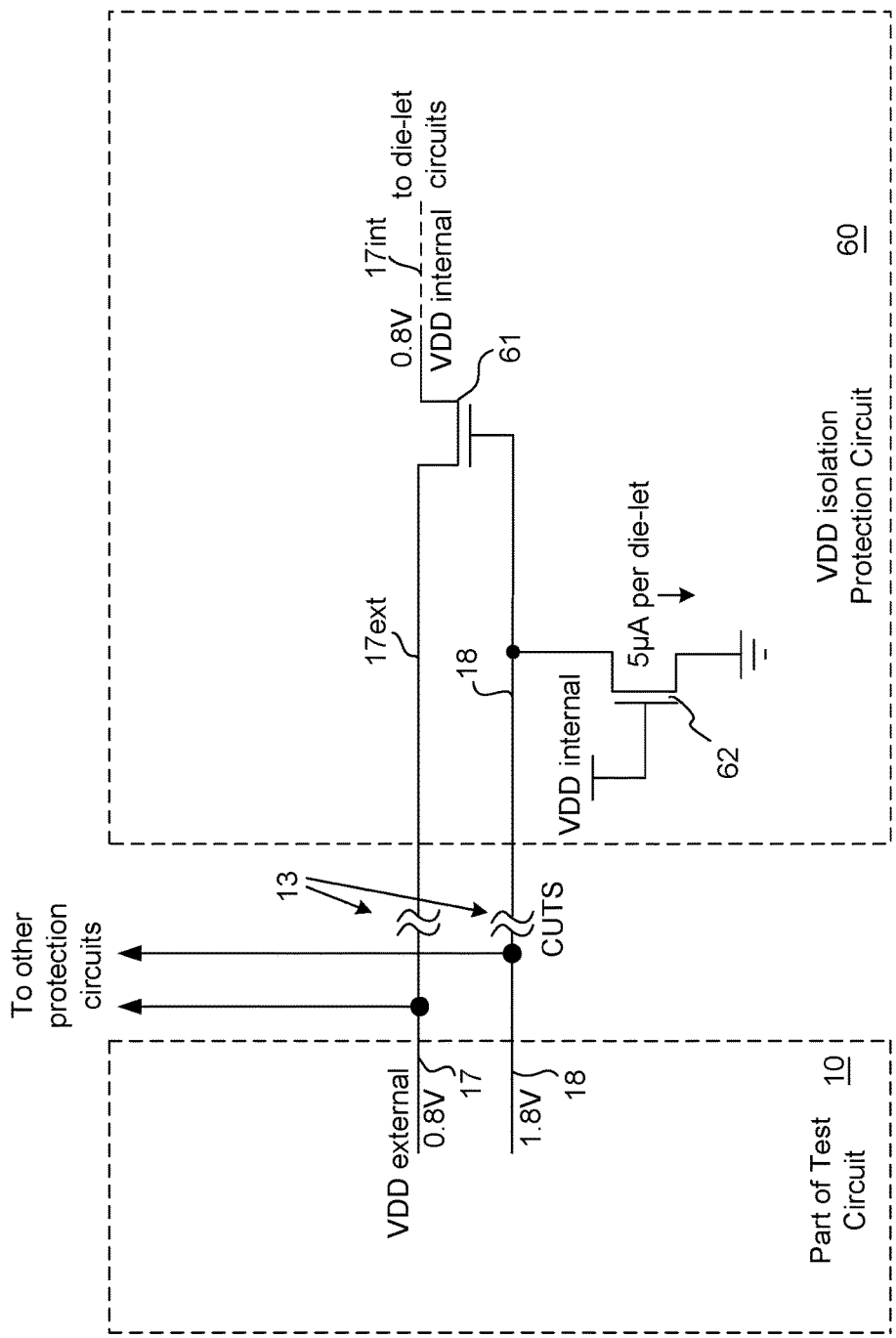
FIG. 4 is a representation of a die-let protection circuit in which the logic power supply is protected in accordance with an embodiment of the present invention.

After the dicing operation, the "VDD external" line $17_{ext}$ is cut, along with the 1.8V line 18 to the resistive structure 62. The NMOS transistor 61 is then permanently in an OFF state and prevents any leakage to the outside of the die-let. Similar protection circuit switches can be added to the "Ground" lines to the die-let. In this case, the circuit is the same as shown in FIG. 4, except that the external and internal VDD power supply line is replaced by "Ground external" and "Ground internal" voltage line.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A protection circuit in an integrated circuit product die-let, the die-let having a plurality of input signal lines from a test circuit for testing or configuring the integrated circuit product die-let before a dicing operation to separate the integrated circuit product die-let from the test circuit on a semiconductor wafer, the protection circuit comprising:

a first signal line having a first terminal extending to an edge of the integrated circuit product die-let and a second terminal;

a logic block connected between a first supply voltage and a second supply voltage, the logic block having an input terminal connected to the second terminal of the first signal line, the logic block having a first output terminal forming a path way for an isolation signal to a plurality of input test circuits within the integrated circuit product die-let, each input test circuit connected to one or more of the plurality of input signal lines from the test circuit before the dicing operation; and a resistive element connected between the first signal line and the second supply voltage, the resistive element connected to the second terminal of the first signal line and generating an input signal to the logic block when the integrated circuit product die-let is separated from the test circuit by the dicing operation, the logic block generating the isolation signal in response to the input signal to the logic block;

whereby the circuits within the integrated circuit product die-let connected to one or more of the input signal lines from a test circuit before the dicing operation are isolated from the cut ends of the input signal lines at the edge of the product die-let after the dicing operation and the integrated circuit product die-let is separated from the test circuit, wherein at least one of the input test circuits comprises a high voltage signal line and an isolation device, the isolation device connected between the high voltage signal line and a circuit of the integrated circuit product die-let, the high voltage signal line co figured to carry a high voltage from the test circuit to the circuit of the integrated circuit product die-let before the dicing operation, the isolation device configured to isolate the high voltage input line from the circuit of the integrated circuit product die-let responsive to receiving the isolation signal after the dicing operation.

2. The protection circuit of claim 1 wherein the resistive element comprises an MOSFET transistor having a source/drain connection to the first signal and a second source/drain at the second supply voltage, and a gate connected to the first supply voltage.

3. The protection circuit of claim 2 wherein the MOSFET transistor comprises an N-channel MOSFET and the second supply voltage is ground and the first supply voltage is positive with respect to ground.

4. The protection circuit of claim 1 wherein the resistive element comprises a diffusion resistor having a first terminal connected to the first signal line and a second terminal at the second supply voltage.

5. The protection circuit of claim 4 wherein the second supply voltage comprises ground.

6. The protection circuit of claim 1 wherein the resistive element comprises a polysilicon resistor having a first terminal connected to the first signal line and a second terminal at the second supply voltage.

7. The protection circuit of claim 6 wherein the second supply voltage comprises ground.

8. The protection circuit of claim 1 wherein the logic block comprises a first logic inverter having an input connected to the second terminal of the first signal line and an output comprising the logic block first output terminal.

9. The protection circuit of claim 8 wherein the logic block further comprises a second logic inverter circuit having an input connected to the output of the first logic inverter circuit and an output forming a path way for a test/configuration signal to circuits within the integrated circuit product die-let for the integrated circuit product die-let to be tested and/or configured by the test circuit before the dicing operation.

10. The protection circuit of claim 1 wherein the first signal line has a cut surface and a longitudinal axis perpendicular to the cut surface, the cut surface coincident with the edge of the integrated circuit product die-let, the first signal line surrounded by a metal trough along the longitudinal axis at the first terminal of the first signal line, the metal trough connected to the second supply voltage.

11. The protection circuit of claim 10 wherein the second supply voltage comprises ground.

12. The protection circuit of claim 1 wherein at least one of the input test circuits comprises the first stage of a buffer circuit.

13. The protection circuit of claim 12 wherein the first stage of the buffer circuit has first and second P-channel MOSFET series-connected between the first supply voltage and an output terminal for the first stage buffer circuit, and first and second N-channel MOSFET parallel connected between the first stage buffer circuit output terminal and the second supply voltage, the gates of the first P-channel MOSFET and of the first N-channel MOSFET connected to an input signal line, and the first output terminal of the logic block connected to the gates of the second of P-channel MOSFET and of the second N-channel MOSFET, the isolation signal on the input signal line isolating the output of the first stage of the buffer circuit from the input signal line.

14. The protection circuit of claim 13 wherein the buffer circuit stage comprises grounding the output terminal.

15. The protection circuit of claim 1 wherein the isolation device comprises a P-channel MOSFET having first source/drain connected to the high voltage signal line and second source/drain connected to the circuit of the integrated circuit product die-let, a gate above the first and second source/drains and a channel region between the first and second source/drain regions, both gate and channel receiving an equivalent signal responsive to the isolation signal so that the P-channel MOSFET is turned off to isolate the high voltage input line from the circuit of the integrated circuit product die-let after the dicing operation.

* * * * *